(12) United States Patent
Kim et al.

(10) Patent No.: US 9,735,061 B1
(45) Date of Patent: Aug. 15, 2017

(54) METHODS TO FORM MULTI THRESHOLD-VOLTAGE DUAL CHANNEL WITHOUT CHANNEL DOPING

(71) Applicant: GLOBALFOUNDRIES Inc., Grand Cayman (KY)

(72) Inventors: Hoon Kim, Clifton Park, NY (US);
Min-gyu Sung, Latham, NY (US);
Ruilong Xie, Niskayuna, NY (US);
Chanro Park, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/014,150

(22) Filed: Feb. 3, 2016

(51) Int. Cl.
| | | |
|---|---|---|
| *H01L 21/44* | (2006.01) |
| *H01L 21/31* | (2006.01) |
| *H01L 21/469* | (2006.01) |
| *H01L 21/8234* | (2006.01) |
| *H01L 21/28* | (2006.01) |
| *H01L 27/088* | (2006.01) |
| *H01L 29/49* | (2006.01) |
| *H01L 29/51* | (2006.01) |

(52) U.S. Cl.
CPC .. *H01L 21/82345* (2013.01); *H01L 21/28185* (2013.01); *H01L 21/823462* (2013.01); *H01L 27/088* (2013.01); *H01L 29/4966* (2013.01); *H01L 29/517* (2013.01)

(58) Field of Classification Search
CPC ....... H01L 21/82345; H01L 21/823462; H01L 29/517; H01L 27/088; H01L 29/4966; H01L 21/28185; H01L 29/0847; H01L 29/1079; H01L 29/4232; H01L 29/66325; H01L 29/66477; H01L 29/78
See application file for complete search history.

(56) References Cited

U.S. PATENT DOCUMENTS

| | | | | |
|---|---|---|---|---|
| 2009/0230481 A1* | 9/2009 | Park | .................. | H01L 21/2256 257/378 |
| 2010/0184260 A1* | 7/2010 | Luo | ................. | H01L 21/823807 438/154 |

(Continued)

*Primary Examiner* — Julio J Maldonado
*Assistant Examiner* — Stanetta Isaac
(74) *Attorney, Agent, or Firm* — Ditthavong & Steiner, P.C.

(57) ABSTRACT

Methods to form multi $V_t$ channels, including a single type of WF material, utilizing lower annealing temperatures and the resulting devices are disclosed. Embodiments include providing an interfacial-layer on a semiconductor substrate; forming a first high-k dielectric-layer on the interfacial-layer; forming a second high-k dielectric-layer and a first cap-layer, respectively, on the first high-k dielectric-layer; removing the second high-k dielectric and first cap layers in first and second regions; forming a second cap-layer on the first high-k dielectric-layer in the first and second regions and on the first cap-layer in a third region; performing an annealing process; removing the second cap-layer from all regions and the first cap-layer from the third region; forming a third high-k dielectric-layer over all regions; forming a work-function composition-layer and a barrier-layer on the third high-k dielectric-layer in all regions; removing the barrier-layer from the first region; and forming a gate electrode over all regions.

12 Claims, 4 Drawing Sheets

(56) References Cited

U.S. PATENT DOCUMENTS

| | | | |
|---|---|---|---|
| 2010/0308418 A1* | 12/2010 | Stahrenberg | H01L 21/82345 257/392 |
| 2011/0260233 A1* | 10/2011 | Nguyen | H01L 21/823462 257/316 |
| 2013/0105901 A1* | 5/2013 | Park | H01L 21/28088 257/368 |
| 2015/0069524 A1* | 3/2015 | Hong | H01L 27/1203 257/392 |

* cited by examiner

METHODS TO FORM MULTI THRESHOLD-VOLTAGE DUAL CHANNEL WITHOUT CHANNEL DOPING

TECHNICAL FIELD

The present disclosure relates generally to designing and fabricating integrated circuit (IC) devices. The present disclosure is particularly applicable to forming multi threshold-voltage ($V_t$) dual channels in an IC device for 7 nanometer (nm) technology node and beyond.

BACKGROUND

Generally, various advanced processes may be utilized in the design and fabrication of IC devices, particularly to aid with forming multi $V_t$ channels in an IC device. Current processes, for example, utilizing lanthanum-oxide ($La_2O_3$) and channel doping in 10 nm node devices, may cause performance degradation and be unsuitable in smaller technology nodes. Such processes may include higher thermal ranges as well as a chemical reaction to achieve uniform $V_t$ shift in short and long channels in an IC device. A plasma channel doping process may be inconsistent due to plasma life time difference in short and long channels. Additionally, different work-function (WF) materials are utilized in different device types (e.g. n-type or p-type) that may require additional lithography steps.

Therefore, a need exists for a methodology enabling formation of multi $V_t$ channels in an IC device, including a single type of WF material, utilizing lower annealing temperatures and the resulting devices.

SUMMARY

An aspect of the present disclosure is a method of forming multi $V_t$ channels in an IC device, including a single type of WF material, utilizing lower annealing temperatures.

An aspect of the present disclosure is an IC device including multi $V_t$ channels and a single type of WF material.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure some technical effects may be achieved in part by a method including providing an interfacial layer on an upper surface of a semiconductor substrate; forming conformally a first high-k dielectric layer on the interfacial layer; forming conformally a second high-k dielectric layer and a first cap layer, respectively, on the first high-k dielectric layer; removing the second high-k dielectric and first cap layers in first and second regions; forming a second cap layer on the first high-k dielectric layer in the first and second regions and on the first cap layer in a third region; performing an annealing process; removing the second cap layer from all regions and the first cap layer from the third region; forming a third high-k dielectric layer over all regions; forming conformally a work-function composition layer and a barrier layer, respectively, on the third high-k dielectric layer in all regions; removing the barrier layer from the first region; and forming a gate electrode over all regions.

In one aspect where the semiconductor substrate is n-type, a high-voltage threshold region is formed in the first region, a low-voltage threshold region is formed in the second region, and a super low-voltage threshold region is formed in the third region.

In another aspect where the semiconductor substrate is p-type, a super low-voltage threshold region is formed in the first region, a low-voltage threshold region is formed in the second region, and a high-voltage threshold region is formed in the third region.

An additional aspect includes forming the third high-k dielectric layer based on a leakage current behavior of the second high-k dielectric layer.

One aspect includes forming the second high-k dielectric layer based on a threshold-voltage shift target.

A further aspect includes forming the work-function composition layer by sandwiching a work-function metal layer between two layers of titanium nitride (TiN).

Another aspect includes forming the first high-k dielectric layer of hafnium-oxide ($HfO_2$) to a thickness of 10 to 30 angstroms (Å), for example 17 Å.

One aspect includes forming the second high-k dielectric layer of $La_2O_3$ to a thickness of 0.1 to 20 Å, for example 10 Å.

In one aspect, after the annealing process, the second high-k dielectric layer is driven into the first high-k dielectric layer with a higher concentration in proximity to the semiconductor substrate than near the gate electrode.

An additional aspect includes determining an annealing temperature based on a concentration level of a metalloid in the second high-k dielectric layer.

Another aspect of the present disclosure is a device including: an interfacial layer on a semiconductor substrate; a first high-k dielectric layer on the interfacial layer; a second high-k dielectric layer, different from the first, defused through the first high-k dielectric layer and into the interfacial layer in a third of three regions; a third high-k dielectric layer over the first high-k dielectric layer in first and second regions and over the second high-k dielectric in the third region; a work-function composition layer on the third high-k dielectric layer in all regions; a barrier layer on the work-function composition layer in the second and third regions; and a gate electrode over all regions.

In another aspect, the semiconductor substrate is n-type and includes a high-voltage threshold region in the first region, a low-voltage threshold region in the second region, and a super low-voltage threshold region in the third region.

In another aspect, the semiconductor substrate is p-type and includes a super low-voltage threshold region in the first region, a low-voltage threshold region in the second region, and a high-voltage threshold region in the third region.

In one aspect, the second high-k dielectric layer is based on a threshold-voltage shift target, and the third high-k dielectric layer is based on a leakage current behavior of the second high-k dielectric layer.

In an additional aspect, the work-function composition layer includes a work-function metal layer sandwiched between two layers of TiN.

In a further aspect, the first high-k dielectric layer includes $HfO_2$ with a thickness of 10 to 30 Å, for example 17 Å.

In one aspect, the second high-k dielectric layer includes $La_2O_3$ with a thickness of 0.1 to 20 Å, for example 10 Å.

In another aspect, the second high-k dielectric layer is driven into the first high-k dielectric layer with a higher concentration in proximity to the semiconductor substrate than near the gate electrode.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

For the purposes of clarity, in the following description, numerous specific details are set forth to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problem of variations and inaccuracies attendant upon forming multi $V_t$ channels in an IC device. The present disclosure addresses and solves such problems, for instance, by, inter alia, including a single type of WF material (e.g. for p and n type channels), utilizing lower annealing temperatures (e.g. less than 900 degrees Celsius (900° C.)), wherein a low-voltage channel does not require channel doping or doping of a high-k dielectric. Additionally, the proposed method provides for a reduction in the number of lithography masks (e.g. two masks) utilized in the proposed process.

Figure 1A:
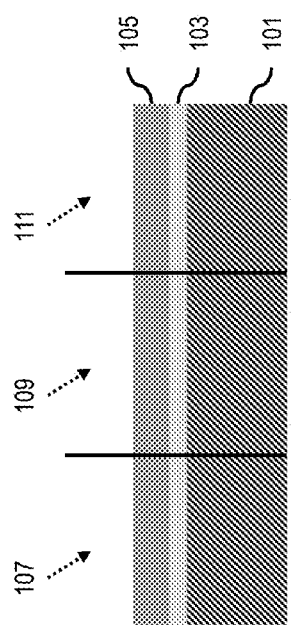
FIGS. 1A through 1J illustrate a process for forming multi $V_t$ channels in an IC device, in accordance with an exemplary embodiment.

FIG. 1A illustrates a semiconductor substrate 101 (e.g., silicon (Si), silicon-germanium (SiGe), etc.), an interfacial layer 103 (e.g. oxide) on an upper surface of the semiconductor substrate 101, and a first high-k dielectric layer 105 (e.g. $HfO_2$ with a thickness of 10 to 30 Å) on an upper surface of the interfacial layer 103. In an n-type semiconductor substrate 101 (e.g. for n-type field-effect-transistor (nFET)), there may be first, 107, second, 109, and third, 111, regions corresponding, respectively, to a high (RVT), low (LVT), and super low (SLVT) threshold voltage. A high threshold voltage (VT) corresponds to a voltage greater than 300 millivolts (mV), a super low VT corresponds to a voltage less than 200 mV, and a low VT corresponds to a voltage between 225 mV and 300 mV.

Figure 1B:
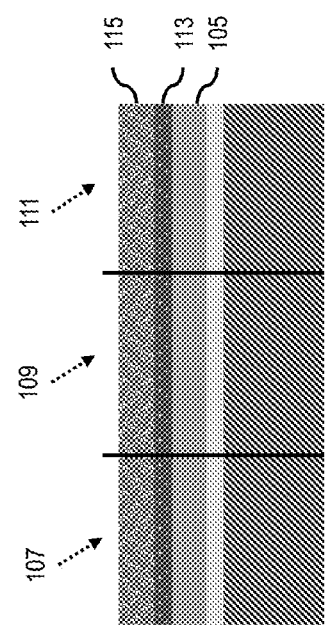

In FIG. 1B, a second high-k dielectric layer 113 (e.g. $La_2O_3$ with a thickness of 0.1 to 20 Å) and a first cap layer 115 (e.g. TiN with a thickness of 10 to 20 Å, for example 15 Å), respectively, may be formed conformally on the first high-k dielectric layer 105 across all three regions 107, 109, and 111. The second high-k dielectric layer may be based on a threshold-voltage shift target.

Figure 1C:
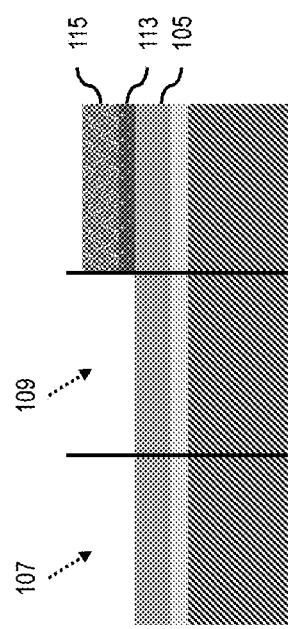

As illustrated in FIG. 1C, the second high-k dielectric 113 and first cap layer 115 may be removed from the first and second, 107/109, regions.

Figure 1D:
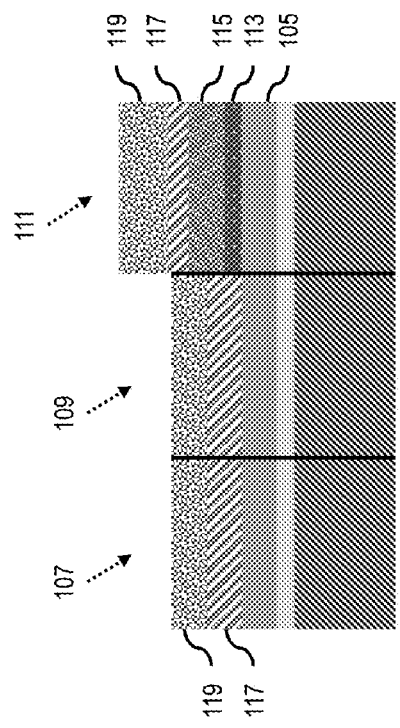

Adverting to FIG. 1D, a second cap layer, including layers 117 and 119 (e.g., TiN and amorphous-silicon), may be formed on the first high-k dielectric layer 105 in the first and second regions 107/109, and on the first cap layer 115 in the third region 111.

Figure 1E:
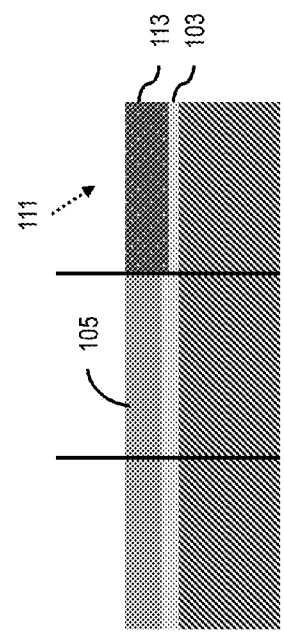

As illustrated in FIG. 1E, an annealing process may be performed to drive a concentration of the second high-k dielectric layer 113 through the first high-k dielectric layer 105 and into the interfacial layer 103 in the third region 111. The annealing temperature (e.g. less than 900° C.) may be based on a concentration level of a metalloid in the semiconductor substrate 101. Concentration of the second high-k dielectric layer is at a closer proximity to the semiconductor substrate than to the gate electrode. The second cap layer, 117/119, may be removed from all regions, and the first cap layer 115 may be removed from the third region 111.

Figure 1F:
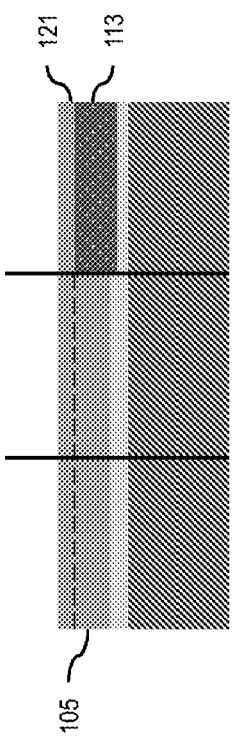
Figure 1G:
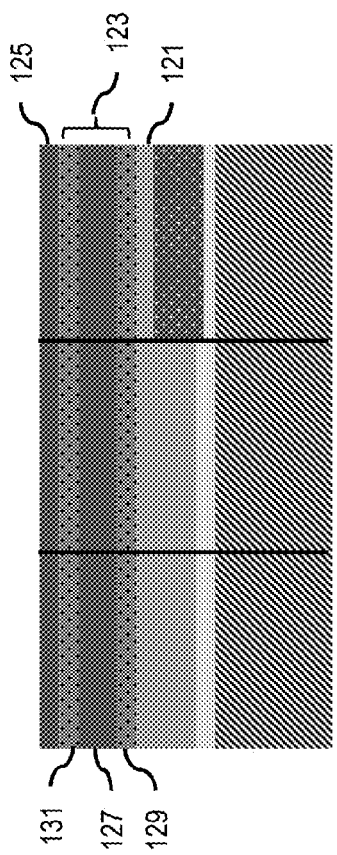

In FIG. 1F, a third high-k dielectric layer 121 (e.g. $HfO_2$) may be formed over all three regions to a thickness of 0.1 to 20 Å. In FIG. 1G, a work-function composition layer 123 and a barrier layer 125 (e.g. fluorine barrier such as 20 to 30 Å of titanium-aluminum-carbide (TiAlC)), respectively, may be formed on the third high-k dielectric layer 121 in all regions. The work-function composition layer 123 may be formed by sandwiching a work-function metal layer 127 (e.g. TiAlC for an n-type work-function (nWF) metal) between two TiN layers 129 and 131. Formation and/or material of the third high-k dielectric layer 121 may be based on a leakage current behavior of the second high-k dielectric layer.

Figure 1H:
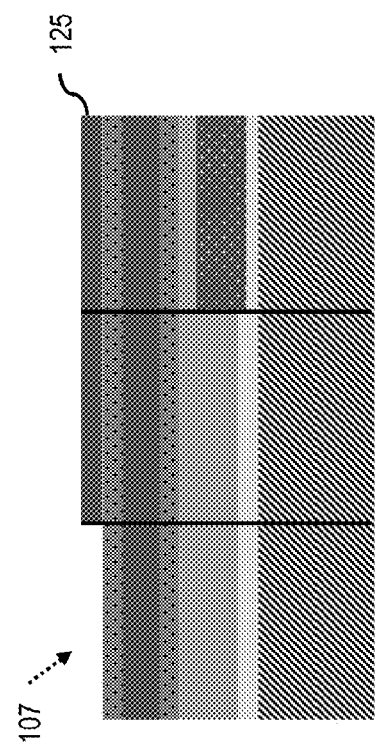
Figure 1I:
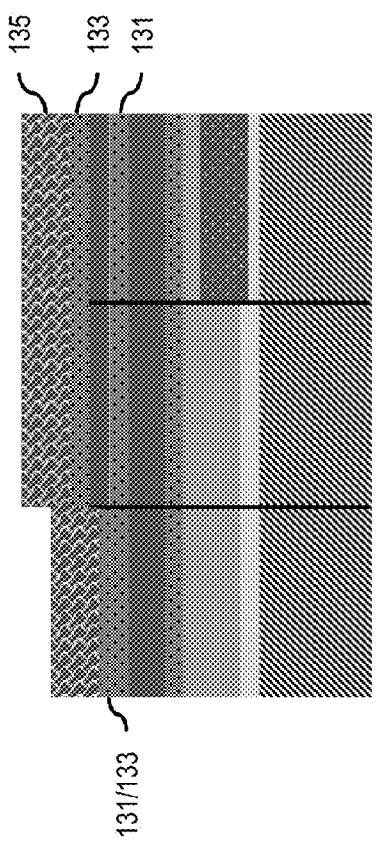

In FIG. 1H, a section of the barrier layer 125 may be removed from the first region 107, for example, by a removal (e.g. etching) process selective to the TiN layer 123. As illustrated in FIG. 1I, a wetting layer 133 (e.g. 10 Å TiN layer formed by chemical vapor deposition) and a gate electrode 135, respectively, may be formed over the work-function composition layer 123 (e.g. on the TiN layer 131) in all regions.

Figure 1J:
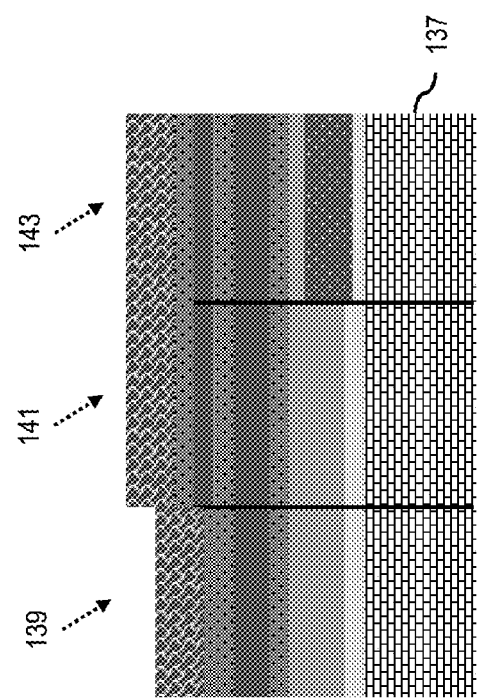

FIG. 1J illustrates a similar structure to that of FIG. 1I, wherein if the semiconductor substrate 137 is a p-type, then first, 139, second, 141, and third, 143, regions, respectively, correspond to SLVT, LVT, and RVT regions. It is noted that due to properties/characteristics of the substrate 137 (e.g. band offset of SiGe), an n-type WF metal (e.g. TiAlC) may still be utilized as a WF metal in a pFET device.

The embodiments of the present disclosure can achieve several technical effects including utilizing efficient and reliable processes to form multi $V_t$ channels, including a single type of WF material, with a reduced annealing temperature budget. Furthermore, the embodiments enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or other devices utilizing logic or high-voltage technology nodes. The present disclosure therefore enjoys industrial applicability in any of various types of highly integrated semiconductor devices, including devices that use SRAM cells (e.g., liquid crystal display (LCD) drivers, digital processors, etc.), particularly for the 7 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   providing an interfacial layer along the entirety of and on an upper surface of a semiconductor substrate;
   forming conformally a first high-k dielectric layer along the entirety of and on the interfacial layer;
   forming conformally a second high-k dielectric layer and a first cap layer, respectively, along the entirety of and on the first high-k dielectric layer while the interfacial layer exists along the entirety of the upper surface of the semiconductor substrate;
   removing the second high-k dielectric and first cap layers in first and second regions;
   forming a second cap layer on the first high-k dielectric layer in the first and second regions and on the first cap layer in a third region;
   performing an annealing process;
   removing the second cap layer from all regions and the first cap layer from the third region;
   forming a third high-k dielectric layer over all regions;
   forming conformally a work-function composition layer and a barrier layer, respectively, on the third high-k dielectric layer in all regions;
   removing the barrier layer from the first region; and
   forming a gate electrode over all regions.

2. The method according to claim 1, wherein the semiconductor substrate is n-type, the method comprising:
   forming a high-voltage threshold region in the first region;
   forming a low-voltage threshold region in the second region; and
   forming a super low-voltage threshold region in the third region.

3. The method according to claim 1, wherein the semiconductor substrate is p-type, the method comprising:
   forming a super low-voltage threshold region in the first region;
   forming a low-voltage threshold region in the second region; and
   forming a high-voltage threshold region in the third region.

4. The method according to claim 1, comprising:
   forming the third high-k dielectric layer based on a leakage current behavior of the second high-k dielectric layer.

5. The method according to claim 1, comprising:
   forming the second high-k dielectric layer based on a threshold-voltage shift target.

6. The method according to claim 1, comprising:
   forming the work-function composition layer by sandwiching a work-function metal layer between two layers of titanium nitride.

7. The method according to claim 1, comprising:
   forming the first high-k dielectric layer of hafnium-oxide to a thickness of 10 to 30 Å.

8. The method according to claim 1, comprising:
   forming the second high-k dielectric layer of lanthanum-oxide to a thickness of 0.1 to 20 Å.

9. The method according to claim 1, wherein after the annealing process, the second high-k dielectric layer is driven into the first high-k dielectric layer with a higher concentration in proximity to the semiconductor substrate than near the gate electrode.

10. The method according to claim 1, comprising:
    determining an annealing temperature based on a concentration level of a metalloid in the second high-k dielectric layer.

11. A method comprising:
    providing an interfacial layer along the entirety of and on an upper surface of a semiconductor substrate;
    forming conformally a first high-k dielectric layer along the entirety of and on the interfacial layer while the interfacial layer exists along the entirety of the upper surface of the semiconductor substrate;
    forming conformally a second high-k dielectric layer and a first cap layer, respectively, on the first high-k dielectric layer, wherein the second high-k dielectric layer is based on a threshold-voltage shift target;
    removing the second high-k dielectric and first cap layers in first and second regions;
    forming a second cap layer on the first high-k dielectric layer in the first and second regions and on the first cap layer in a third region;
    performing an annealing process, wherein an annealing temperature is based on a concentration level of a metalloid in the second high-k dielectric layer;
    removing the second cap layer from all regions and the first cap layer from the third region;
    forming a third high-k dielectric layer over all regions, wherein the third high-k dielectric layer is based on a leakage current behavior of the second high-k dielectric layer;
    forming conformally a work-function composition layer and a barrier layer, respectively, on the third high-k dielectric layer in all regions;
    removing the barrier layer from the first region; and
    forming a gate electrode over all regions.

12. The method according to claim 11, wherein an n-type semiconductor substrate includes a high-voltage threshold region in the first region, a low-voltage threshold region in the second region, and a super low-voltage threshold region in the third region, and wherein a p-type semiconductor includes a super low-voltage threshold region in the first region, a low-voltage threshold region in the second region, and a high-voltage threshold region in the third region.

* * * * *